US012406871B2

(12) United States Patent
Singu et al.

(10) Patent No.: US 12,406,871 B2
(45) Date of Patent: Sep. 2, 2025

(54) SUBSTRATE SUSCEPTOR USING EDGE PURGING

(71) Applicant: ASM IP HOLDING B.V., Almere (NL)

(72) Inventors: Raj Singu, Phoenix, AZ (US); Todd Robert Dunn, Cave Creek, AZ (US); Carl Louis White, Gilbert, AZ (US); Herbert Terhorst, Amersfoort (NL); Eric James Shero, Phoenix, AZ (US); Bhushan Zope, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 517 days.

(21) Appl. No.: 17/816,052

(22) Filed: Jul. 29, 2022

(65) Prior Publication Data

US 2022/0380895 A1 Dec. 1, 2022

Related U.S. Application Data

(62) Division of application No. 16/875,088, filed on May 15, 2020, now Pat. No. 11,404,302.

(60) Provisional application No. 62/851,414, filed on May 22, 2019.

(51) Int. Cl.
*H01L 21/687* (2006.01)
*B25B 11/00* (2006.01)
(Continued)

(52) U.S. Cl.
CPC ........ *H01L 21/6838* (2013.01); *B25B 11/005* (2013.01); *C23C 16/45544* (2013.01);
(Continued)

(58) Field of Classification Search
CPC .......... H01L 21/68735; H01L 21/6838; H01L 21/6875; H01L 21/68785; H01L 21/68742;
(Continued)

(56) References Cited

U.S. PATENT DOCUMENTS 3,407,783 A 10/1968 Capita
3,549,847 A 12/1970 Clark et al.
(Continued)

FOREIGN PATENT DOCUMENTS

CN 102308362 1/2012
CN 103733327 4/2014
(Continued)

OTHER PUBLICATIONS

"Shaping the Future in Semiconductor Processing." Advertisement for Morton International, Inc., Ceramic Solutions. vol. 73, No. 7, Jul. 1994: advertisements (circa 1993).

*Primary Examiner* — Mahdi H Nejad
(74) *Attorney, Agent, or Firm* — Snell & Wilmer L.L.P.

(57) ABSTRACT

A workpiece susceptor body can include a front face configured to support a workpiece, a back face opposite the front face, a workpiece contact zone at least partially forming a support boundary on an inner portion of the front face, and a plurality of axial channels disposed within the susceptor body. The workpiece contact zone can be disposed radially inward of an outer edge of a workpiece positioned on the front face in a processing configuration. Each of the plurality of axial channels may connect to corresponding openings extending into an outer portion of the front face. Each of the openings may be disposed radially outward of the workpiece contact zone of the susceptor body.

11 Claims, 10 Drawing Sheets

(51) Int. Cl.

| | | |
|---|---|---|
| C23C 16/44 | (2006.01) | |
| C23C 16/455 | (2006.01) | |
| C23C 16/458 | (2006.01) | |
| C23C 16/46 | (2006.01) | |
| H01L 21/67 | (2006.01) | |
| H01L 21/683 | (2006.01) | |

(52) U.S. Cl.
CPC .......... *C23C 16/4584* (2013.01); *C23C 16/46* (2013.01); *H01L 21/68735* (2013.01); *H01L 21/68785* (2013.01)

(58) Field of Classification Search
CPC ........... H01L 21/68764; C23C 16/4586; C23C 16/45521; C23C 16/4584
USPC .......................................... 269/21; 118/728
See application file for complete search history.

(56) References Cited

U.S. PATENT DOCUMENTS

| | | | |
|---|---|---|---|
| 3,641,974 A | 2/1972 | Yamada et al. | |
| 3,796,182 A | 3/1974 | Rosler | |
| 4,499,354 A | 2/1985 | Hill et al. | |
| 4,522,149 A | 6/1985 | Garbis et al. | |
| 4,560,420 A | 12/1985 | Lord | |
| 4,710,428 A | 12/1987 | Tamamizu et al. | |
| 4,821,674 A | 4/1989 | deBoer et al. | |
| 4,958,061 A | 9/1990 | Wakabayashi et al. | |
| 4,978,567 A | 12/1990 | Miller | |
| 4,986,215 A | 1/1991 | Yamada et al. | |
| 4,990,374 A | 2/1991 | Keeley et al. | |
| 5,033,407 A | 7/1991 | Mizuno et al. | |
| 5,044,943 A | 9/1991 | Bowman et al. | |
| 5,071,670 A | 12/1991 | Kelly | |
| 5,074,017 A | 12/1991 | Toya et al. | |
| 5,098,198 A | 3/1992 | Nulman et al. | |
| 5,108,792 A | 4/1992 | Anderson et al. | |
| 5,119,540 A | 6/1992 | Kong et al. | |
| 5,119,541 A | 6/1992 | Ohmi et al. | |
| 5,121,531 A | 6/1992 | Severns et al. | |
| 5,156,820 A | 10/1992 | Wong et al. | |
| 5,188,501 A | 2/1993 | Tomita et al. | |
| 5,199,483 A | 4/1993 | Bahng | |
| 5,200,157 A | 4/1993 | Toya et al. | |
| 5,242,501 A | 9/1993 | McDiarmid | |
| 5,292,554 A | 3/1994 | Sinha et al. | |
| 5,298,465 A | 3/1994 | Levy | |
| 5,304,248 A | 4/1994 | Cheng et al. | |
| 5,306,699 A | 4/1994 | Eddy | |
| 5,308,645 A | 5/1994 | Zachman et al. | |
| 5,332,442 A | 7/1994 | Kubodera et al. | |
| 5,343,938 A | 9/1994 | Schmidt | |
| 5,354,715 A | 10/1994 | Wang et al. | |
| 5,356,486 A | 10/1994 | Sugarman et al. | |
| 5,370,739 A | 12/1994 | Foster et al. | |
| 5,383,971 A | 1/1995 | Selbrede | |
| 5,393,349 A | 2/1995 | Ohkase | |
| 5,403,401 A | 4/1995 | Haafkens et al. | |
| 5,421,893 A | 6/1995 | Perlov | |
| 5,427,620 A | 6/1995 | deBoer et al. | |
| 5,444,217 A | 8/1995 | Moore et al. | |
| 5,455,069 A | 10/1995 | Lee | |
| 5,456,757 A | 10/1995 | Aruga et al. | |
| 5,461,214 A | 10/1995 | Peck et al. | |
| 5,467,220 A | 11/1995 | Xu | |
| 5,492,566 A | 2/1996 | Sumnitsch | |
| 5,514,439 A | 5/1996 | Sibley | |
| 5,516,367 A | 5/1996 | Lei et al. | |
| 5,527,393 A | 6/1996 | Sato et al. | |
| 5,549,756 A | 8/1996 | Sorensen et al. | |
| 5,551,985 A | 9/1996 | Brors et al. | |
| 5,558,717 A | 9/1996 | Zhao et al. | |
| 5,584,936 A | 12/1996 | Pickering et al. | |
| 5,588,827 A | 12/1996 | Muka | |
| 5,620,525 A | 4/1997 | van de Ven et al. | |
| 5,645,646 A | 7/1997 | Beinglass et al. | |
| 5,656,093 A | 8/1997 | Burkhart et al. | |
| 5,683,518 A | 11/1997 | Moore et al. | |
| 5,690,742 A | 11/1997 | Ogata et al. | |
| 5,700,725 A | 12/1997 | Hower et al. | |
| 5,738,165 A | 4/1998 | Imai | |
| 5,761,023 A | 6/1998 | Lue et al. | |
| 5,792,304 A | 8/1998 | Tamura et al. | |
| 5,800,622 A | 9/1998 | Takemi et al. | |
| 5,803,977 A | 9/1998 | Tepman et al. | |
| 5,834,737 A | 11/1998 | Hirose et al. | |
| D404,370 S | 1/1999 | Kimura | |
| 5,895,530 A | 4/1999 | Shrotriya et al. | |
| 5,938,850 A | 8/1999 | Arami et al. | |
| 5,960,159 A | 9/1999 | Ikeda et al. | |
| 6,001,183 A | 12/1999 | Gurary et al. | |
| 6,020,212 A | 2/2000 | Mathis | |
| 6,040,011 A * | 3/2000 | Yudovsky | H01L 21/68792 |
| | | | 118/728 |
| 6,068,441 A | 5/2000 | Raaijmakers et al. | |
| 6,077,357 A | 6/2000 | Rossman et al. | |
| 6,086,680 A | 7/2000 | Foster et al. | |
| 6,090,212 A | 7/2000 | Mahawili | |
| 6,093,252 A | 7/2000 | Wengert et al. | |
| 6,113,702 A * | 9/2000 | Halpin | H01L 21/68735 |
| | | | 118/728 |
| 6,167,834 B1 | 1/2001 | Wang et al. | |
| 6,293,749 B1 | 9/2001 | Raaijmakers et al. | |
| 6,325,858 B1 | 12/2001 | Wengert et al. | |
| 6,331,023 B1 | 12/2001 | Goodwin et al. | |
| 6,343,183 B1 | 1/2002 | Halpin et al. | |
| 6,394,797 B1 | 5/2002 | Sugaya et al. | |
| 6,402,850 B1 | 6/2002 | Beinglass et al. | |
| 6,464,790 B1 | 10/2002 | Sherstinsky et al. | |
| 6,608,287 B2 | 8/2003 | Halpin et al. | |
| 6,634,882 B2 | 10/2003 | Goodman | |
| 6,709,267 B1 | 3/2004 | Hawkins et al. | |
| D496,008 S | 9/2004 | Takahashi et al. | |
| 6,893,507 B2 | 5/2005 | Goodman et al. | |
| 7,033,445 B2 | 4/2006 | Keeton et al. | |
| D525,127 S | 7/2006 | Cogley et al. | |
| D600,223 S | 9/2009 | Aggarwal et al. | |
| 7,601,224 B2 | 10/2009 | Foree | |
| 7,602,224 B2 | 10/2009 | Foree | |
| 7,648,579 B2 | 1/2010 | Goodman et al. | |
| 7,722,441 B2 | 5/2010 | Goela et al. | |
| 7,740,703 B2 | 6/2010 | Hasegawa et al. | |
| 8,088,225 B2 | 1/2012 | Goodman et al. | |
| 8,287,648 B2 | 10/2012 | Reed et al. | |
| 8,366,830 B2 | 2/2013 | Nakamura et al. | |
| 8,394,229 B2 | 3/2013 | Aggarwal et al. | |
| 8,801,857 B2 | 8/2014 | Aggarwal et al. | |
| D743,357 S | 11/2015 | Vyne | |
| 9,558,985 B2 | 1/2017 | Wang et al. | |
| D784,276 S | 4/2017 | Tiner et al. | |
| 9,633,889 B2 | 4/2017 | Cuvalci et al. | |
| 9,698,042 B1 | 7/2017 | Baldasseroni et al. | |
| 9,719,169 B2 | 8/2017 | Mohn et al. | |
| 10,068,791 B2 | 9/2018 | Parsey, Jr. et al. | |
| D830,981 S | 10/2018 | Jeong et al. | |
| 10,242,848 B2 | 3/2019 | Jeon et al. | |
| 10,242,890 B2 | 3/2019 | Volfovski et al. | |
| 10,376,916 B2 | 8/2019 | Ranish et al. | |
| 10,388,557 B2 | 8/2019 | Kawamura et al. | |
| D864,134 S | 10/2019 | Watarai et al. | |
| D914,620 S | 3/2021 | Rokkam et al. | |
| 11,018,047 B2 | 5/2021 | Rokkam et al. | |
| D920,936 S | 6/2021 | Rokkam et al. | |
| 2002/0011211 A1 | 1/2002 | Halpin | |
| 2002/0043337 A1 | 4/2002 | Goodman et al. | |
| 2002/0144786 A1* | 10/2002 | Chiang | C23C 16/45561 |
| | | | 156/345.52 |
| 2003/0000472 A1 | 1/2003 | Lim et al. | |
| 2003/0049580 A1 | 3/2003 | Goodman | |
| 2003/0075109 A1* | 4/2003 | Arai | C23C 16/4581 |
| | | | 118/728 |
| 2004/0060512 A1 | 4/2004 | Waldhauer et al. | |
| 2004/0229002 A1 | 11/2004 | Davis et al. | |

(56) References Cited

U.S. PATENT DOCUMENTS

| | | |
|---|---|---|
| 2005/0092439 A1 | 5/2005 | Keeton et al. |
| 2005/0193952 A1* | 9/2005 | Goodman .......... H01L 21/68735 |
| | | 118/728 |
| 2005/0284372 A1 | 12/2005 | Murugesh et al. |
| 2006/0057826 A1 | 3/2006 | De Boer |
| 2009/0235866 A1 | 9/2009 | Kataigi et al. |
| 2009/0280248 A1 | 11/2009 | Goodman et al. |
| 2010/0031884 A1 | 2/2010 | Aggarwal et al. |
| 2010/0107974 A1 | 5/2010 | Givens et al. |
| 2012/0211933 A1 | 8/2012 | Goto |
| 2013/0109192 A1 | 5/2013 | Hawkins et al. |
| 2016/0002778 A1 | 1/2016 | Ravi et al. |
| 2016/0068996 A1 | 3/2016 | Lau et al. |
| 2016/0133504 A1 | 5/2016 | Chu et al. |
| 2017/0175265 A1* | 6/2017 | Shah ................... C23C 16/4584 |
| 2018/0094350 A1 | 4/2018 | Verghese et al. |
| 2018/0138074 A1 | 5/2018 | Lee et al. |
| 2019/0139807 A1* | 5/2019 | White ............... H01L 21/68764 |
| 2019/0355612 A1 | 11/2019 | Sakurai |
| 2020/0234996 A1 | 7/2020 | Rokkam et al. |
| 2020/0373187 A1* | 11/2020 | Singu .................. B25B 11/005 |
| 2021/0125853 A1 | 4/2021 | Rathi et al. |

FOREIGN PATENT DOCUMENTS

| | | |
|---|---|---|
| CN | 106463365 | 2/2017 |
| EP | 0339279 | 11/1989 |
| EP | 0448346 | 3/1991 |
| EP | 0445596 | 9/1991 |
| EP | 0634785 | 1/1995 |
| EP | 0669640 | 8/1995 |
| EP | 0766289 | 4/1997 |
| EP | 0840358 | 5/1998 |
| GB | 2181458 | 4/1987 |
| JP | 7-58039 | 3/1995 |
| JP | 2000-269310 | 9/2000 |
| JP | 2002-184843 | 6/2002 |
| JP | 2002-526915 | 8/2002 |
| JP | 2003-124167 | 4/2003 |
| JP | 2006-228802 | 8/2006 |
| JP | 2007-502022 | 2/2007 |
| JP | D1422195 | 8/2014 |
| JP | D1547357 | 4/2016 |
| JP | D1570747 | 2/2018 |
| JP | D1570748 | 2/2018 |
| KR | 10-1999-0069084 | 9/1999 |
| KR | 1999-0069091 | 9/1999 |
| KR | 100460338 | 1/2005 |
| KR | 10-2007-0098025 | 10/2007 |
| TW | D111900 | 7/2006 |
| TW | D136587 | 8/2010 |
| TW | D184695 | 8/2017 |
| TW | D191199 | 6/2018 |
| WO | WO 1996/30713 | 10/1996 |
| WO | WO 1997/08743 | 3/1997 |
| WO | WO 2010/016964 | 2/2010 |

* cited by examiner

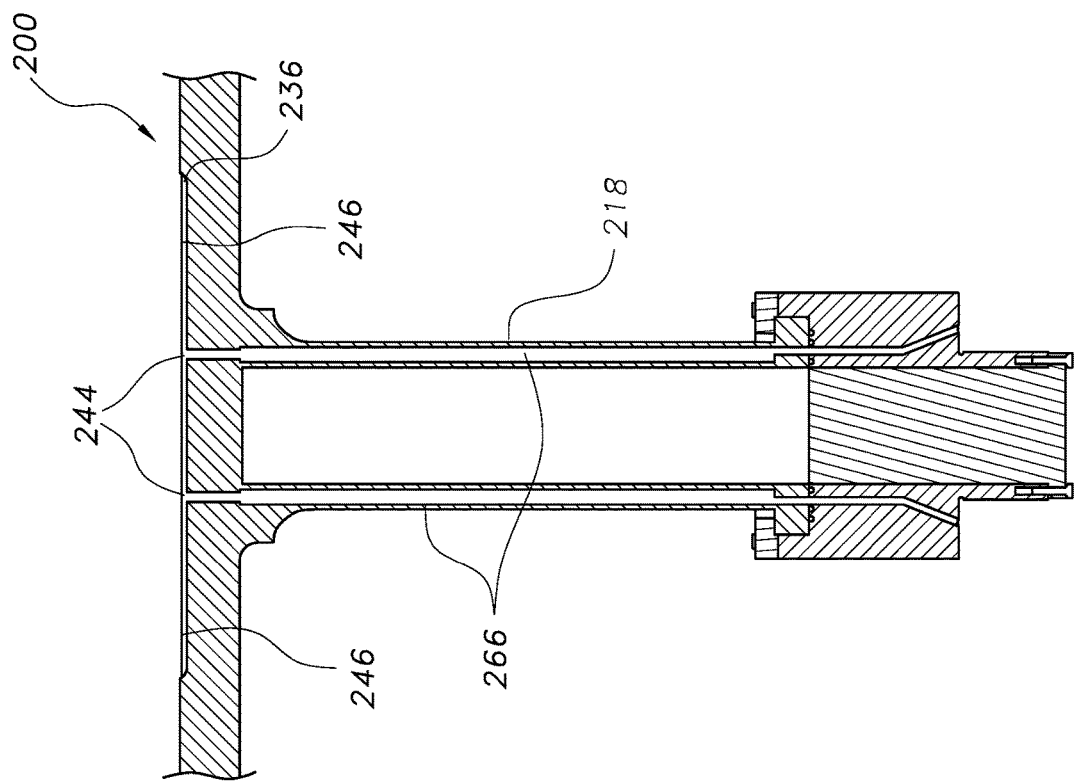

SUBSTRATE SUSCEPTOR USING EDGE PURGING

CROSS REFERENCE TO RELATED APPLICATIONS

This application is a division of U.S. patent application Ser. No. 16/875,088, filed May 15, 2020, which claims the benefit of priority to U.S. Provisional Application No. 62/851,414, filed May 22, 2019, which is hereby incorporated by reference herein in its entirety. Any and all applications for which a foreign or domestic priority claim is identified in the Application Data Sheet as filed with the present application are hereby incorporated by reference under 37 CFR 1.57.

BACKGROUND

Field of the Disclosure

This disclosure relates generally to semiconductor processing, and more particularly to susceptors for supporting semiconductor substrates in process chambers.

Description of Related Art

Semiconductor fabrication processes are typically conducted with the substrates supported within a reaction chamber on a susceptor under controlled process conditions. For many processes, semiconductor substrates (e.g., wafers) are heated inside the reaction chamber. A number of quality control issues related to the physical interaction between the substrate and the susceptor can arise during processing.

SUMMARY

In some embodiments, a workpiece susceptor is provided. The workpiece susceptor body comprises a front face configured to support a workpiece and a back face opposite the front face. The workpiece susceptor also includes a workpiece contact zone at least partially forming a support boundary around an inner portion of the front face. The workpiece contact zone is configured to be disposed radially inward of an outer edge of a workpiece positioned on the front face in a processing configuration. The workpiece susceptor also includes one or more axial channels that are disposed within the susceptor body. The axial channels connect to one or more openings extending into an outer portion of the front face. Each of the openings are disposed radially outward of the workpiece contact zone of the susceptor body. The workpiece contact zone is at a greater elevation than the outer portion of the face to form a gap radially outward of the workpiece contact zone and axially between the face of the susceptor body and the workpiece.

In some embodiments, a method for purging a workpiece susceptor is provided. The method comprises loading a workpiece onto a workpiece contact zone on a front face of a susceptor body, such that an outer edge of the workpiece is disposed radially outward from the workpiece contact zone. The method further includes positioning the workpiece in a processing configuration such that the front face of the susceptor body is in fluid communication with a reaction chamber and such that a back face of the susceptor body is in fluid communication with a loading chamber. The method includes providing a first pressure within the reaction chamber and purging a backside of the outer edge of the workpiece by flowing purge gas at a second pressure from one or more channels within the susceptor body, to a gap radially outward of the workpiece contact zone and axially between the front face of the susceptor plate and the workpiece, to the reaction chamber. The second pressure is greater than the first pressure.

BRIEF DESCRIPTION OF THE DRAWINGS

The above, as well as additional objects, features and advantages of the present inventive concept, will be better understood through the following illustrative and non-limiting detailed description of embodiments of the present invention, with reference to the appended drawings. In the drawings like reference numerals will be used for like elements unless stated otherwise.

FIG. 5 shows a cross-sectional view of an example susceptor body.

DETAILED DESCRIPTION

Figure 1:
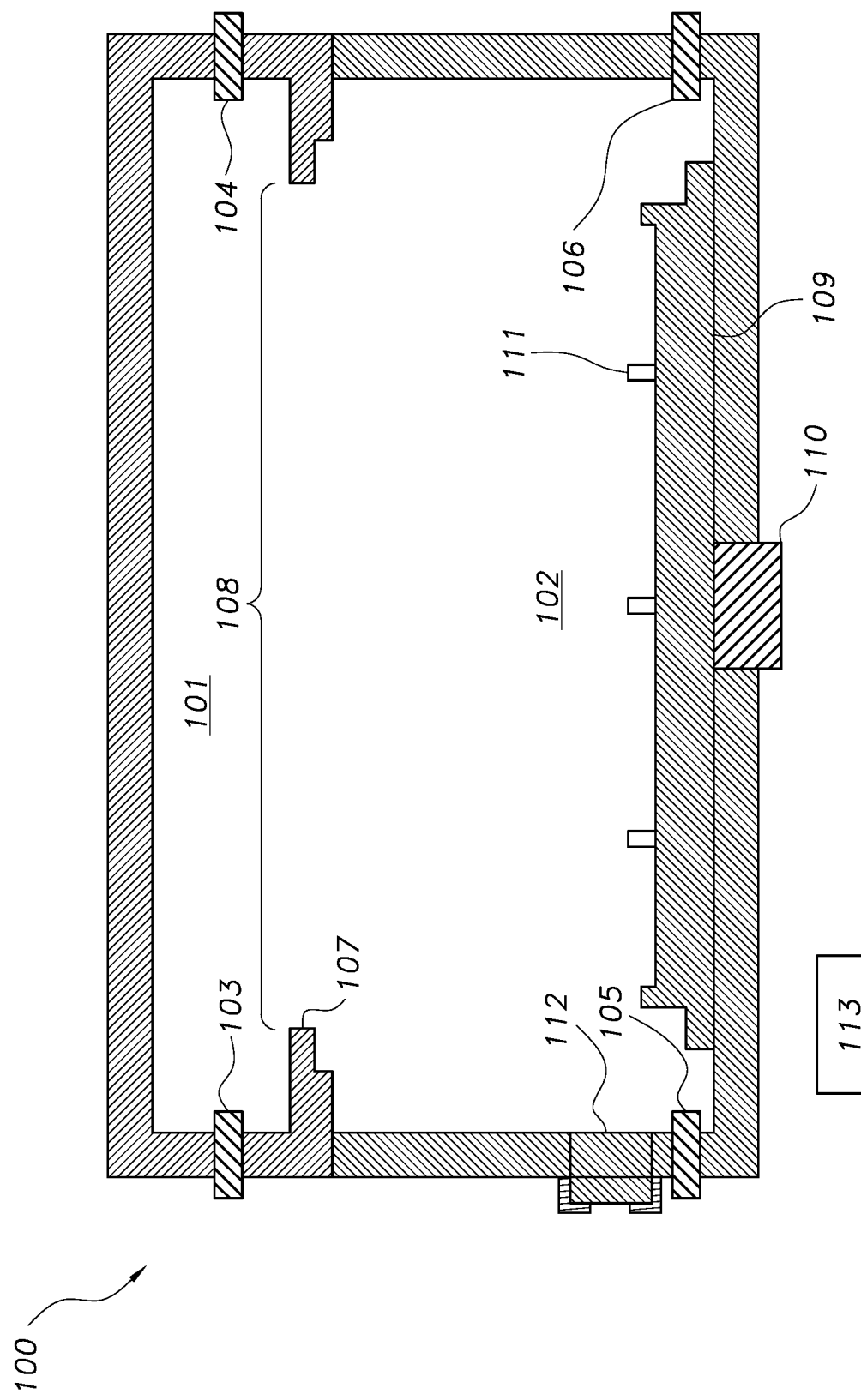
FIG. 1 schematically illustrates a cross-section of a semiconductor processing apparatus with a workpiece support in a loading position, according to one embodiment.

Although certain embodiments and examples are disclosed below, it will be understood by those having ordinary skill in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

Substrate preparation and processing can require precision manufacturing techniques and apparatus. Moreover, their processing can require maintenance and cleaning. Described herein are various embodiments for improving the cleanliness and quality of substrate processing.

Various types of substantially flat workpieces, such as substrates (e.g., wafers, including semiconductor wafers) are commonly processed on susceptor assemblies within a processing apparatus. Susceptor assemblies may include a susceptor, which can be formed by machining various hard materials (e.g., ceramic, graphite) into a desired shape and optionally applying a coating (e.g., silicon carbide (SiC)). Susceptors can be formed in different shapes to support workpieces of various shapes, but many are circular.

As noted above, a number of quality control issues can arise during processing, relating to the interaction between the reactant and the susceptor, particularly during processing of the substrate. These issues can include, for example, backside deposition on the substrate, undesired deposition on various parts or regions of the susceptor assembly and/or processing apparatus. Such quality control issues can decrease the overall quality and production of the substrates and semiconductor devices, resulting in reduced yield and increased costs.

Backside deposition occurs when process gases flow into the space between the substrate and the susceptor and deposit on a back surface of the substrate. Because the flow of the process gases is not controlled between the substrate and the susceptor, random deposition can occur on the backside of the substrate. In addition to issues noted above, this random deposition can create thickness inconsistencies on the backside, which can affect local site flatness on the frontside, and ultimately cause device uniformity issues.

In a typical process, a reactant gas is passed over the heated wafer, causing the chemical vapor deposition (CVD) of a thin layer of reactant material on the wafer. Through sequential processing, multiple layers are made into integrated circuits. Other exemplary processes include sputter deposition, photolithography, dry etching, plasma processing, and high temperature annealing. Many of these processes require high temperatures and can be performed in the same or similar reaction chambers. The reactant gas can include a metal chloride (e.g., titanium chloride, titanium tetrachloride, etc.), other metal compounds (e.g., molybdenum, tungsten, etc.), a silicon-based gas (e.g., silane, di-silane, tri-silane, etc.), an oxidation gas (e.g., $H_2O$, $O_2$, $O_3$, etc.), and/or any other suitable reactant gas. Various films can be prepared, such as metal-based (e.g., titanium, molybdenum, tungsten, etc.) films, silicon-based films, and/or other films. The film may include an oxide layer. In some embodiments, the reactant gas can include a mixture of any of the above gases (or combinations thereof) with other gases, such as hydrogen. In some embodiments, two or more reactant gases can be implemented. For example, a first reactant gas (e.g., molybdenum gas) may be used which excludes hydrogen and/or a second reactant gas may include a mixture with hydrogen (e.g., molybdenum gas plus hydrogen). The second reactant gas may be passed over the substrate after the first reactant gas.

Wafers may be processed at various temperatures to promote high quality deposition. Temperature control is especially helpful at temperatures below the mass transport regime, such as about 500° C. to 900° C. for silicon CVD using silane. In this kinetic regime, if the temperature is not uniform across the surface of the wafer, the deposited film thickness will be uneven. However, lower temperatures may sometimes be used in certain scenarios.

The diameter of the wafer can influence the processing as well. In recent years, single-wafer processing of large diameter wafers has become more widely used for a variety of reasons, including the desire for greater precision in process control than may be achieved with batch-processing. Wafers may be made of silicon, most commonly with a diameter of about 150 mm (about 6 inches) or of about 200 mm (about 8 inches) and with a thickness of about 0.725 mm. Recently, larger silicon wafers with a diameter of about 300 mm (about 12 inches) and a thickness of about 0.775 mm have been utilized because they exploit the benefits of single-wafer processing even more efficiently. Even larger wafers are expected in the future. A typical single-wafer susceptor includes a pocket or recess within which the wafer rests during processing. In many cases, the recess is shaped to receive the wafer very closely.

To address some of the issues described above, a susceptor assembly or processing apparatus can include purge channel designs. As noted, these improvements may reduce reactant within a reaction chamber from coming in contact with a backside of a substrate (e.g., wafer), a face of a susceptor assembly, or other undesired areas. When reactant inadvertently comes in contact with certain areas of the processing apparatus or susceptor assembly, the corresponding areas may need to be cleaned. This can create not only additional labor in processing substrates but may also reduce the quality of future wafer processing.

Reference will now be made to the Figures.

FIG. 1 schematically illustrates an embodiment of a semiconductor processing apparatus 100 comprising a reaction chamber 101 and a loading chamber 102. Together, the reaction chamber 101 and the loading chamber 102 may be considered a process module, for example, to be implemented into multi-module "cluster" tools. In the illustrated embodiment, the reaction chamber 101 is disposed above the loading chamber 102, and they are separated by a baseplate 107 and a movable pedestal or workpiece support 109, described in more detail below.

In some embodiments, the reaction chamber 101 may be substantially smaller than the loading chamber 102, contrary to the schematic drawings, which are not drawn to scale. For a single wafer process module, as shown, the reaction chamber 101 may have a volume between about 0.25 liters and 3 liters. In some embodiments, the reaction chamber 101 may have a volume of less than about 1 liter. In some embodiments, the reaction chamber 101 may be about 900 mm long, 600 mm wide, and 5 mm high. In some embodiments, the loading chamber 102 may have a volume between about 30 liters and about 50 liters. In some embodiments, the loading chamber 102 may have a volume of about 40 liters. In some embodiments, the loading chamber 102 may have a volume about 35-45 times the volume of the reaction chamber 101.

In some embodiments, the reaction chamber 101 may comprise one or more inlets 103 (one shown) and one or more outlets 104 (one shown). During processing, gases such as reactants and purge gases may flow into the reaction chamber 101 through the reaction chamber inlet 103, and gases such as excess reactants, reactant byproducts, and purge gases may flow out of the reaction chamber 101 through the reaction chamber outlet 104. In some embodiments, the loading chamber 102 may comprise one or more inlets 105 (one shown) and one or more outlets 106 (one shown). In operation, gases such as purge gases may flow into the loading chamber 102 through the loading chamber inlet 105, and gases such as excess reactants, reactant byproducts, and purge gases may flow out of the loading chamber 102 through the loading chamber outlet 106. The depicted configuration, such as the positions of the inlets 103, 105 and outlets 104, 106 are merely schematic, and may be adjusted based on, for example, the process to be performed in the reaction chamber 101, the desired flow path of the gases, etc. Purge gases can include a single purge gas or a mixture of purge gases. For example, in some embodiments, the purge gas can consist essentially of one or more inert gases, such as one or more noble gases (e.g., helium, argon, neon, xenon, etc.). The purge gas can include one or more inert gases without any reactive gases. In other embodiments, the purge gas can include, for example, one or more inert gases and one or more other non-inert gases. The purge gas can include an inert gas mixed with a reactive gas, such as hydrogen. The purge gas may include a mixture of hydrogen and argon, for example. In some embodiments, a first purge gas consisting essentially of one or more inert gases (i.e., without any reactive gases) can be used in a first purge step, and a second purge gas comprising a mixture of one or more inert gases mixed with one or more reactive gases can be used in a second purge step. In some embodiments, this second purge step sequentially follows this first purge step. Using a purge step that includes one or more inert gases with one or more reactive gases may help improve the distribution of a reactant across the substrate. For example, a delivery system (e.g., shower) may generally concentrate the reactant near a center of the substrate. During a second purge step, a mixture of inert and reactive gases can provide a better distribution of reactant near, for example, the edges of the substrate.

In the illustrated embodiment, the reaction chamber 101 comprises a baseplate 107 including an opening 108. An interior edge of the baseplate 107 defines the opening 108. In some embodiments, the baseplate 107 may comprise titanium. In the illustrated embodiment, the reaction chamber inlet 103 is located approximately opposite to the reaction chamber outlet 104, such that reaction gas that flows from the reaction chamber inlet 103 to the reaction chamber outlet 104 travels approximately parallel to a face of the workpiece W, and thus parallel to the upper surface of the moveable support. Such reactors are sometimes referred to as "cross-flow" or horizontal laminar flow reactors. In some embodiments, the apparatus 100 may be an atomic layer deposition (ALD) reactor, such that it includes valves controlled by a control system 113 to separately provide pulses of reactants. In some embodiments, apparatus 100 may include two or more valves independently controlled by control system 113 to allow regulation of relative pressure and/or the direction of flow between reaction chamber 101 and loading chamber 102. In some embodiments, the reaction chamber inlet 103 may comprise a distribution system such to distribute gas in a desirable pattern. In some embodiments, the reaction chamber 101 may taper near the reaction chamber outlet 104, such that the height of the reaction chamber 101 decreases near the reaction chamber outlet 104, thereby constricting air flow through the reaction chamber outlet 104. Although the apparatus 100 may be described herein with respect to vapor deposition (e.g., chemical vapor deposition, or CVD, and/or atomic layer vapor deposition, or ALD) reactors, the apparatus 100 may alternatively comprise other semiconductor processing tools, including, but not limited to, dry etchers, ashers, rapid thermal annealers, etc.

The apparatus 100 further comprises the moveable support 109, configured to be moved between a loading position and a processing position by operation of a drive mechanism 110. FIG. 1 depicts the support 109 in the loading position, according to one embodiment. The support 109 may be configured to hold a workpiece (semiconductor workpiece W see FIG. 2), such as a silicon wafer. The workpiece W may be loaded and unloaded into the support 109 in various ways, such as with an end effector of a robot. The support 109 may comprise lift-pins 111 and/or cutouts to aid in loading and unloading of the workpiece W with a paddle or fork. The support 109 may comprise a vacuum system that holds the workpiece W in place after loading, or gravity alone may hold the workpiece W in a pocket that is sized and shaped to accommodate the workpiece W. The apparatus 100 may further comprise one or more gate valves 112 (one shown) for loading and unloading of workpieces W to and from the support 109. The gate valve 112 may allow access to, for example, a transfer chamber, load lock, processing chamber, clean room, etc.

The control system 113 is also configured or programmed to control the drive mechanism 110. In some embodiments, the drive mechanism 110 may comprise a piston or elevator that imparts vertical movement to the support 109. The drive mechanism 110 is therefore configured to move the support 109, and thus the workpiece W disposed on the support 109, into the processing position during a reactor closure operation and into the loading position during a reactor opening operation. The drive mechanism 110 can also be configured to rotate the workpiece W disposed on the support 109.

Figure 2:
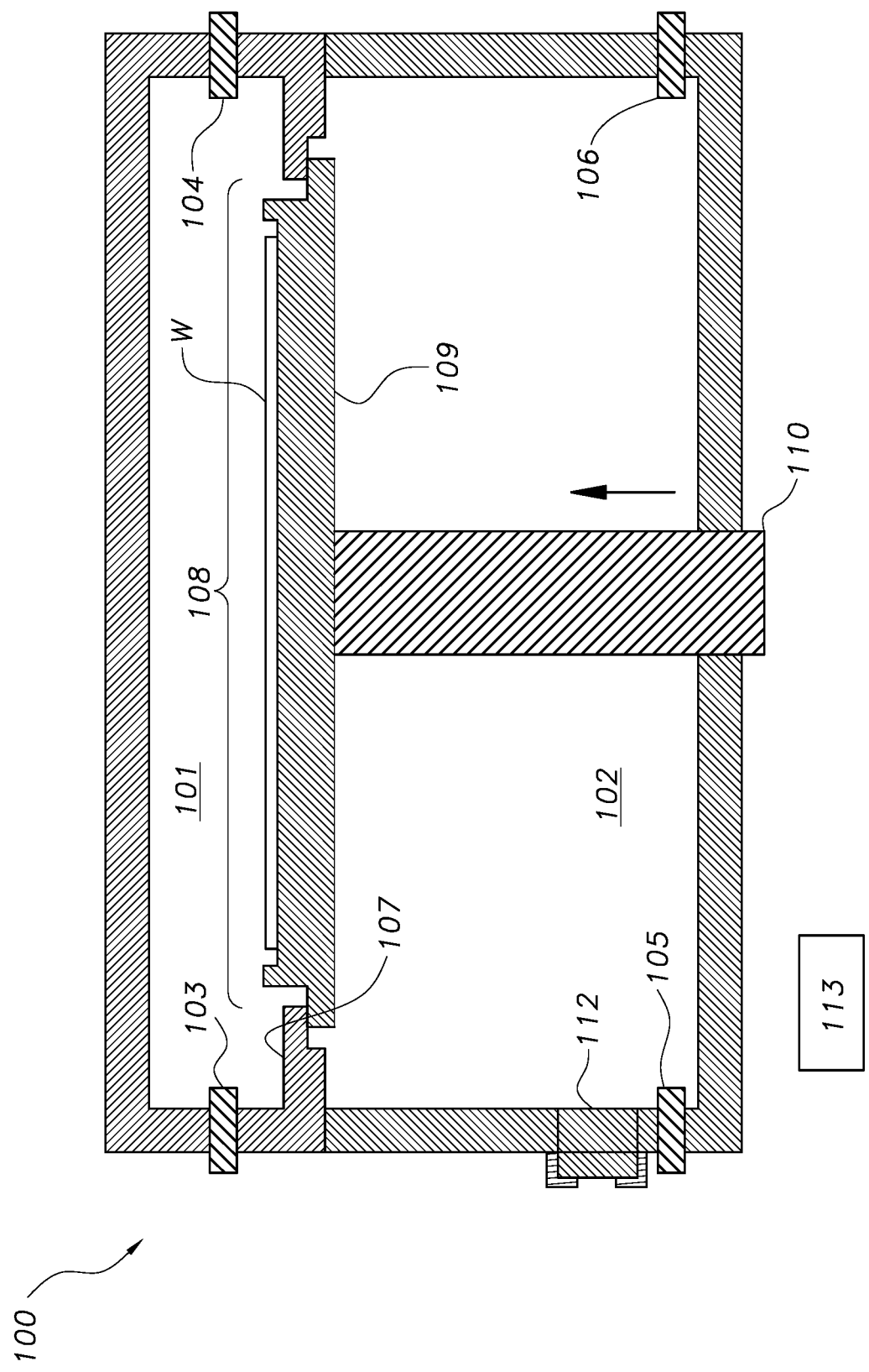
FIG. 2 schematically illustrates the apparatus of FIG. 1 with the workpiece support shown in a processing position, according to one embodiment.

FIG. 2 schematically illustrates the apparatus 100 with the support 109 shown in the processing position, according to one embodiment. When in the processing position, the support 109 engages the baseplate 107, effectively isolating or separating the interior of the reaction chamber 101 from the loading chamber 102. Such isolation can reduce contamination between the reaction chamber 101 and the loading chamber 102. In some embodiments, engaging may comprise creating a hard metal-on-metal seal between the baseplate 107 and the support 109. In some embodiments, engaging may comprise compression of pliable material, such as an O-ring, on either part, to create a soft seal between the baseplate 107 and the support 109. In some embodiments, engaging may comprise maintaining a gap between the support 109 and the baseplate 107, such that there is no absolute seal. Even where engaging comprises maintaining a gap between the support 109 and the baseplate 107, the support may still effectively separate the reaction chamber 101 from the loading chamber 102 by creating a substantial barrier to fluid communication between the reaction chamber 101 and the loading chamber 102 when apparatus 100 is in the processing position.

Figure 3:
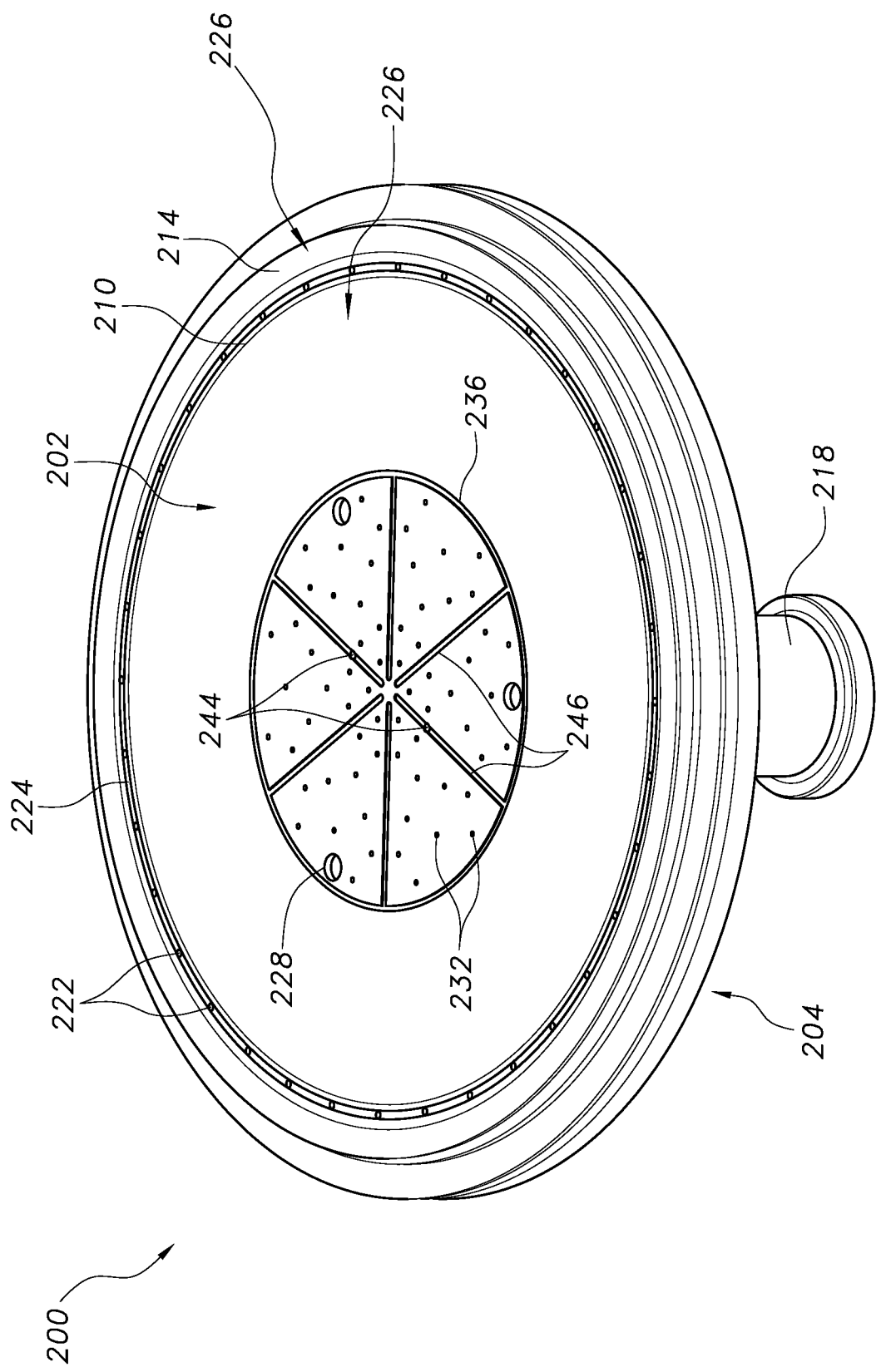
FIG. 3 shows an example susceptor body that includes a pedestal that supports a back face and a front face.

FIG. 3 shows an example susceptor body 200. The support 109 illustrated in FIGS. 1 and 2 can include the susceptor body 200. The susceptor body 200 can include a back face 204 and a front face 202. The susceptor body 200 can include a pedestal 218 that supports the back face 204 and the front face 202. The front face 202 can be opposite the back face 204. The front face 202 may be substantially flat throughout, with some features extending into or from the front face 202 as described herein. The front face 202 can be configured to support a workpiece, such as a substrate (e.g., a wafer). The front face 202 and/or the back face 204 may form one or more shapes, such as a circle, ellipse, rectangle, etc. As shown in FIG. 3, the front face 202 may be substantially circular. Accordingly, the term "circumferential" or related terms are used throughout. However, the concepts described herein may be applied for other shapes as well.

The body 200 can include one or more openings 222. The opening(s) 222 can extend into an outer portion 220 of the front face 202. The openings 222 can provide edge purging to a workpiece supported on the front face 202, as described further herein. The openings 222 can be in fluid communication with one or more axial channels (e.g., channel(s) 252 shown in FIGS. 4A-4C) disposed within the susceptor body 200, for example, at least partially between the front face 202 and the back face 204. In some embodiments, the body can include a circumferentially extending axial channel. For example, a circumferentially extending axial channel 224 can extend into the front face 202. The opening(s) 222 can be in communication with the circumferentially extending axial channel 224, as shown. The circumferentially extending axial channel can extend in a complete circumference, to form a ring-shaped channel, as shown.

The purge openings 222 may be configured to have a fixed or variable cross sectional area, to control flow there through. For example, the purge openings 222 may include a corresponding flow control valve, such as a needle valve, to provide adjustable flow. In some embodiments, the openings 222 can comprise fixed orifices with a desired cross sectional area (e.g., corresponding to a given diameter) and/or in desired quantities to provide a desired amount of edge purge flow under some process conditions. For example, the susceptor body 200 can have between about 15 and 36 purge openings 222 and in some embodiments has 18. Each of the purge openings 222 can have a diameter in a range between about 0.5 mm and 2 mm, and in some embodiments the diameter is about 1.85 mm.

The susceptor body 200 can include a workpiece contact zone 210. The workpiece contact zone 210 may at least partially form a support boundary around an inner portion 226 of the front face 202. In some embodiments, a seal can be formed at the interface between the workpiece contact zone 210 and a substrate held thereupon, to prevent flow between the outer portion 220 and inner portion 226 of the front race 202. The workpiece contact zone 210 can be configured to be disposed radially inward of the outer edge of a workpiece that is positioned on the front face 202. The workpiece contact zone 210 can be at a greater elevation than the outer portion 220 of the front face 202 to form a gap (not shown) radially outward of the workpiece contact zone 210 and axially between the front face 202 of the susceptor body 200 and the workpiece when the workpiece is positioned on the front face 202. The workpiece contact zone 210 can include a circumferential rib extending from the front face 202. Each of the openings 222 can be disposed radially outward of the workpiece contact zone 210. The workpiece contact zone 210 can have a thickness (i.e., radial width) in a range between about 1.5 mm and about 3 mm, and in some embodiments the thickness is about 2 mm. In embodiments where it is circular, the workpiece contact zone 210 can form an approximately annular support ring having a diameter in a range between about 286 mm and about 292 mm, and in some embodiments (e.g., embodiments configured to hold 300 mm workpieces) the diameter is about 288 mm. In some embodiments, the radial distance from an outer edge of a workpiece to the workpiece contact zone 210 can be in a range between about 10 mm and about 12 mm, and in some embodiments, about 12 mm.

The susceptor body can include a workpiece retaining portion 214. The workpiece retaining portion 214 can include a radially-inward facing circumferential rim. The workpiece retaining portion 214 may be positioned radially outward from the one or more openings 222 and may be configured to prevent radial movement of the workpiece. This can prevent damage to the workpiece and promote higher quality deposition of the workpiece. The workpiece retaining portion 214 can extend to a greater elevation than the workpiece contact zone 210, to retain a workpiece supported on the workpiece contact zone. The susceptor body 200 can include a circumferential edge facing radially outward of the workpiece retaining portion 214. In some embodiments, the workpiece retaining portion 214 can have an elevation above the front face 202 in a range between about 0.8 mm and about 1 mm, and in some embodiments the elevation is about 0.9 mm.

The susceptor body 200 may include an inner vacuum region within the inner portion 226 of the front face 202. The vacuum region can be radially inward of the opening(s) 222, axial channels(s) (e.g., circumferential purge channel 224) and/or the workpiece contact zone 210. The inner vacuum region may include one or more vacuum grooves extending into the front face 202. For example, a circumferential groove 236 may extend into the front face 202 to form an outer vacuum boundary. One or more radial vacuum grooves can extend into the front face 202. The inner vacuum region may be split into one or more sections by the one or more radial vacuum grooves 246. The radial vacuum grooves 246 may form 2, 3, 4, 5, 6, or more sections of the inner vacuum region. The susceptor body 200 may include one or more vacuum apertures 244 that extend into the inner vacuum region of the front face 202. The vacuum apertures 244 may be in fluid communication with a vacuum. When the workpiece is on the front face 202, the vacuum may be applied via the vacuum apertures 244 and apply negative pressure to the workpiece along the radial vacuum grooves 246, the circumferential groove 236, and/or other regions of the inner vacuum region. The susceptor body 200 may include embossed and/or raised features in the inner vacuum region, such as the raised features 232 shown in FIG. 3. The raised features 232 may provide a small separation between the workpiece and a portion of the front face 202 (e.g., the inner vacuum region). This separation may improve the functionality and efficacy of the applied vacuum. The raised features 232 may help reduce sticking of the workpiece to the susceptor body 200, and/or may reduce direct contact with the backside of the workpiece, which in turn can reduce contamination or potential workpiece damage. The raised features 232 may also improve the uniformity of heat conduction to the workpiece 206.

One or more lift pin holes 228 may be included that allow for lift pins to extend through the body 200, and allow a workpiece (e.g., a wafer) to be placed on the front face 202 and/or removed therefrom. The lift pin holes 228 may be disposed radially inward of the circumferential groove 236 or radially outward therefrom. In some embodiments, there are three lift pin holes 228, but another number is possible.

Figure 4A:
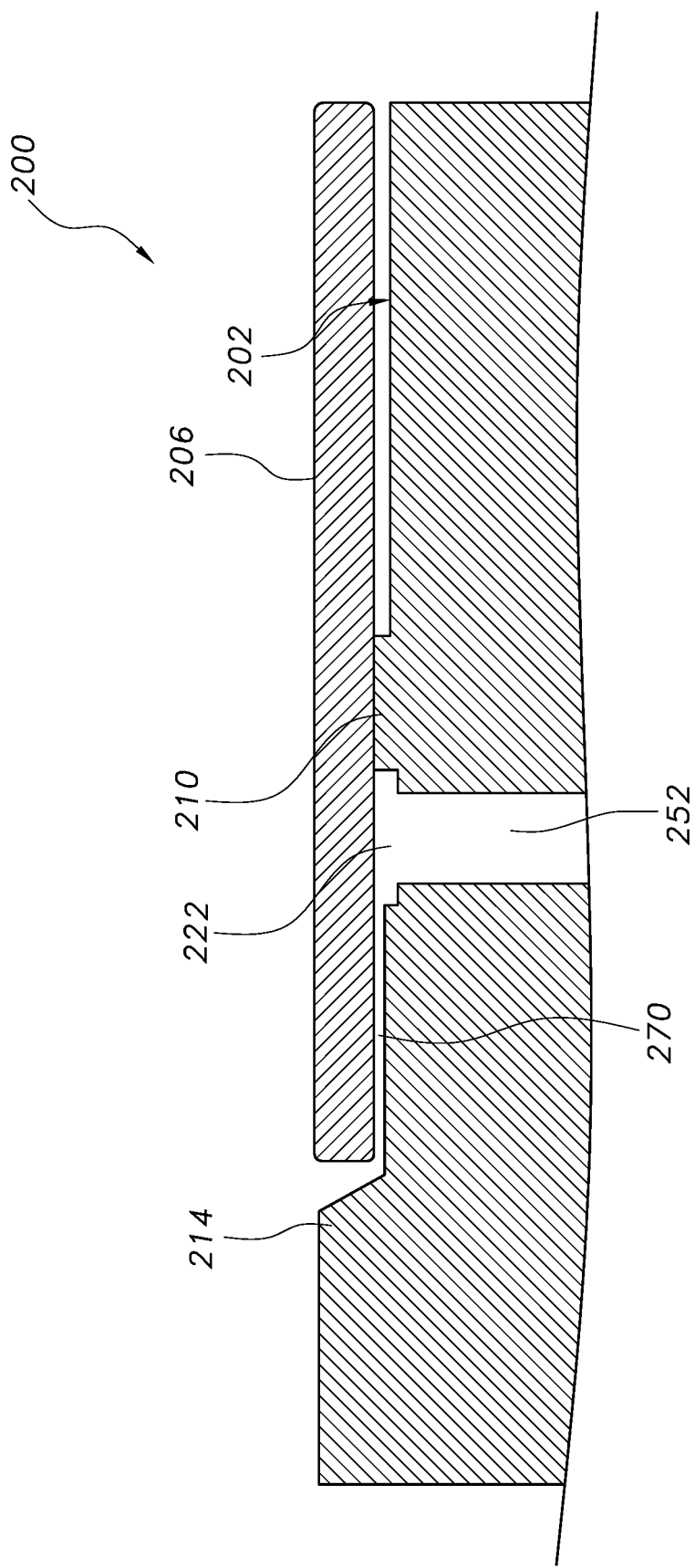
FIG. 4A shows a schematic cross-sectional side view of a portion of the susceptor body.

FIG. 4A shows a schematic cross-sectional side view of a portion of the susceptor body 200 described above with respect to FIG. 3. For example, FIG. 4A shows an axial purge channel 252 and opening 222 disposed within the susceptor body 200, between the front face 202 and the back face 204. In some embodiments, each of the axial purge channels 252 may be in fluid communication via the circumferential purge channel 224 (FIG. 3).

The workpiece 206 is shown in contact with the workpiece contact zone 210 of the front face 202. As shown, the workpiece contact zone 210 can be at a greater elevation than the outer portion 220 of the face 202. In some designs a fluid gap 270 can be formed between the workpiece 206 and the front face 202 radially outward of the workpiece contact zone 210. The embodiment shown can allow for purge fluid to flow through the axial purge channel 252 and opening 222, within gap 270 along the backside of the workpiece 206, and around the outer edge of workpiece 206. This configuration can reduce or prevent gas used for deposition on the front side of the workpiece 206 from depositing material on the edge or backside of the workpiece 206. In some embodiments, purge can flow through a circumferential purge channel, such as channel 224 shown in FIG. 3. In some embodiments, the fluid gap 270 can be in a range between about 0.1 mm and about 0.18 mm, and in some embodiments the fluid gap 270 is about 0.15 mm.

FIG. 4A also shows further detail of an embodiment wherein the workpiece retaining portion 214 is disposed at a greater elevation than the workpiece contact zone 210 as described above with respect to FIG. 3.

Figure 4B:
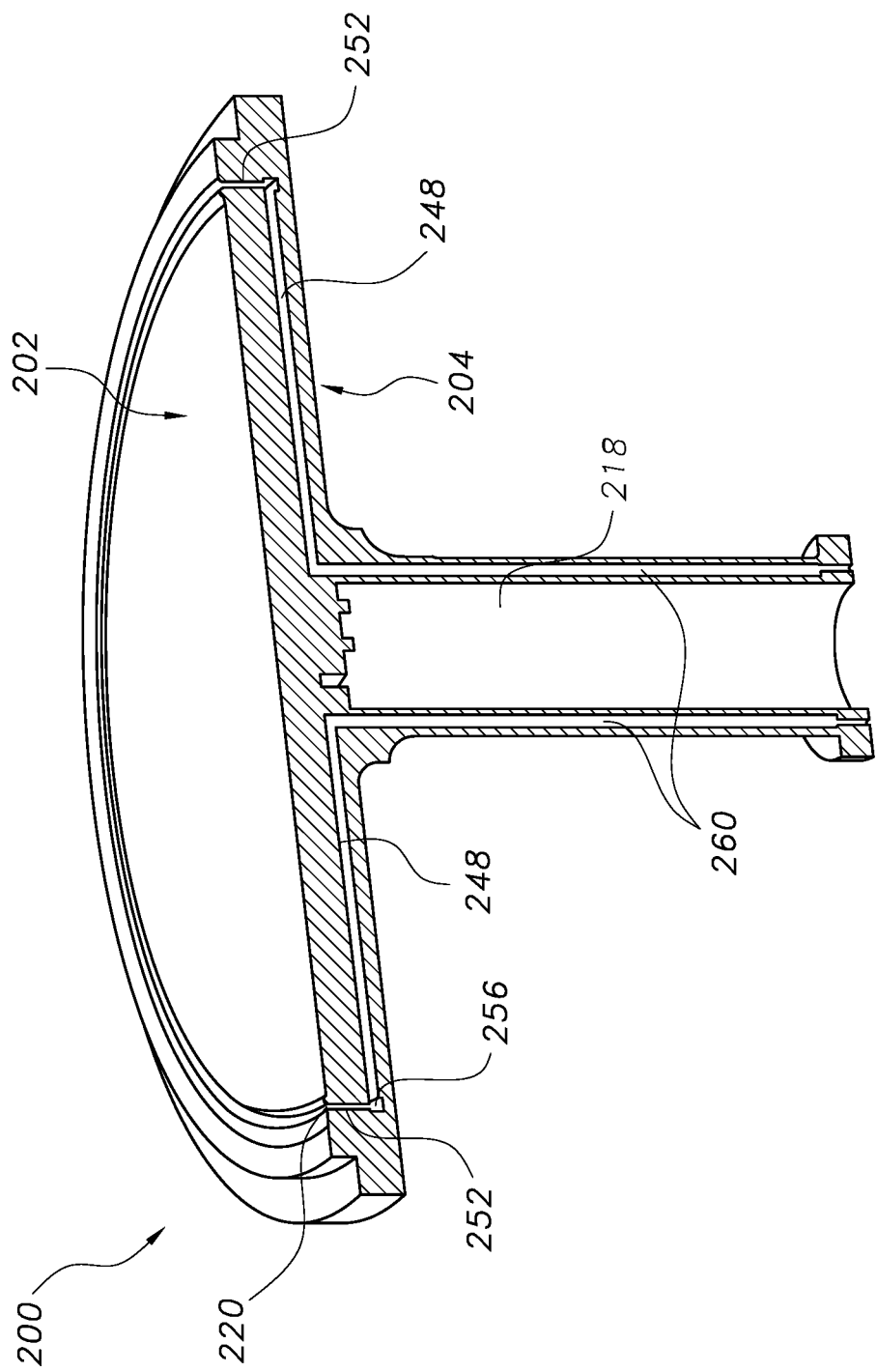
FIG. 4B shows a perspective cross-sectional view of an example susceptor body with a pedestal.

FIG. 4B shows a perspective cross-sectional view of an example susceptor body 200 with a pedestal 218. The pedestal 218 can be used to support susceptor body 200, for example, by supporting via attachment to the back face 204. The pedestal 218 may additionally or alternatively include one or more channels therein. For example, one or more pedestal purge channels 260 can be disposed within the pedestal 218. The one or more pedestal purge channels 260 may extend longitudinally through the pedestal 218 and may be configured to be in fluid communication with at least one of the plurality of the openings 222. For example, the susceptor body 202 can include two axial purge channels 252 as described elsewhere herein. The susceptor body 200 may include one or more radial purge channels 248 positioned between the front face 202 and the back face 204. The one or more radial purge channels 248 may extend from and/or be in fluid communication with at least one of the axial purge channels 252, and can provide fluid communication between the axial channels 252 and the longitudinal pedestal channels 260. In some embodiments, a circumferential groove, shown as a circumferential purge channel 256, can be in fluid communication with (e.g., provide fluid communication between) the radial channels 248 and the axial channels 252. In some embodiments, the pedestal purge channels 260 can have a diameter in a range of between about 3 mm and about 5 mm, and in some embodiments is about 4 mm. The radial purge channels 248 can have a diameter in a range of between about 2 mm and about 4 mm, and in some embodiments is about 3 mm.

Figure 4C:
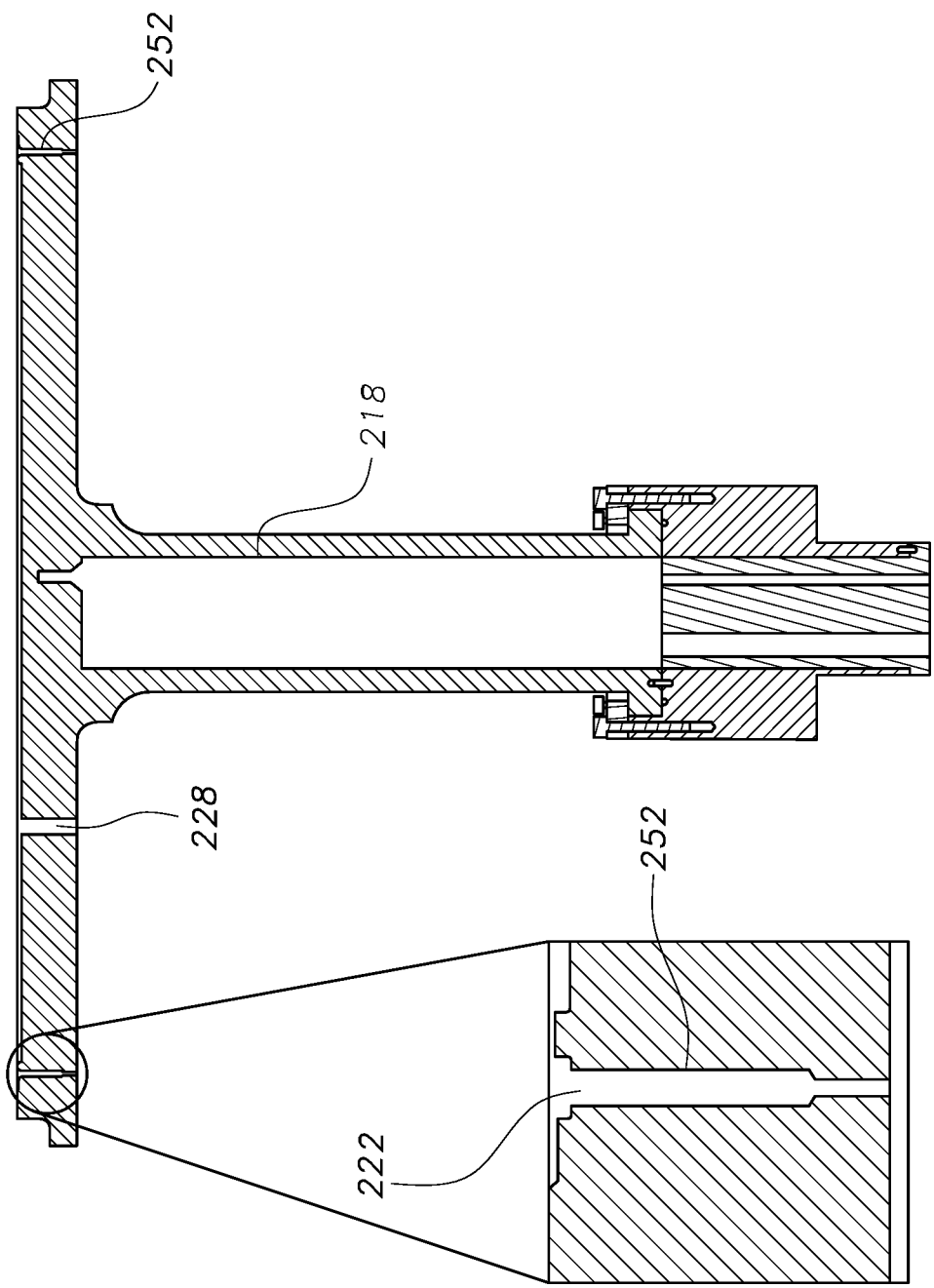
FIG. 4C shows an example susceptor body that includes axial purge channels that connect a front face of the body with a back face of the body.

FIG. 4C shows an example susceptor body 200 that includes axial purge channels 252 that connect the front face 202 with the back face 204. As best shown in the detail view, in some embodiments the axial purge channels 252 may pass completely through the body 200, from and through the front face 202 to the back face 204, and through the back face 204. As also described above with respect to FIG. 3, the susceptor body 200 can include lift pin holes 228. As shown, the pedestal 218 may be attached to or include other features, such as an anchoring assembly to provide a secure attachment to a lifting mechanism, fluidics, and/or other features.

FIG. 5 shows a cross-sectional view of an example susceptor body 200. In some embodiments, the view shown in FIG. 5 is a view of a cross section along a plane different from (e.g., orthogonal to) the view shown in FIG. 4C, and shows many similar vacuum features discussed above and shown in FIG. 3. As shown here, a susceptor body 200 can include one or more pedestal vacuum channels 266 that are in fluid communication with one or more radial vacuum grooves 246. The circumferential groove 236 is also shown. The pedestal vacuum channels 266 may be disposed radially near an edge of the pedestal 218. The pedestal vacuum channels 266 may be longitudinal (to form a longitudinal vacuum channel) and may extend through the pedestal 218. In some embodiments, the vacuum channels 266 are configured to be in fluid communication with one or more of the vacuum apertures 244. Additionally or alternatively, the pedestal vacuum channels 266 may be in fluid communication with at least one of the plurality of radial vacuum grooves 246. The radial vacuum grooves 246 may be in fluid communication with the vacuum apertures 244 and/or the circumferential groove 236. In some embodiments, the vacuum holes 244 can have a separation distance from one another in a range of between about 43 mm and about 52 mm, and in some embodiments is about 51.5 mm.

Figure 6:
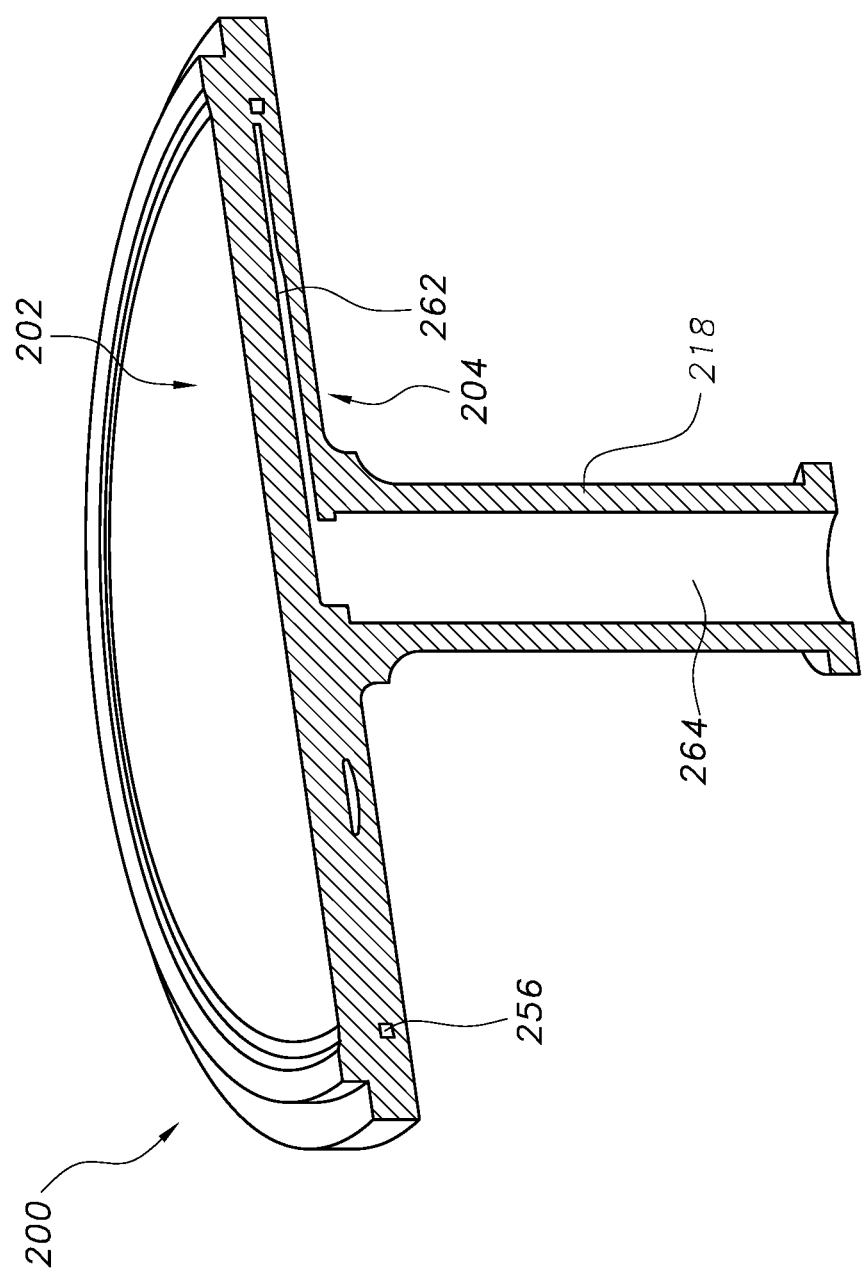
FIG. 6 shows a perspective of a cross-section of an example susceptor body.

FIG. 6 shows a perspective of a cross-section of an example susceptor body 200. The cross-section may be along a plane different from that shown in FIGS. 4A and 4B. As shown, the circumferential purge channel 256 may be disposed throughout the susceptor body 200. This arrangement of the circumferential purge channel 256 can allow for greater access to and penetration of any purge gas throughout the susceptor body 200 (e.g., between the front face 202 and the back face 204).

A thermocouple channel, such as a radial thermocouple channel 262 is also shown. The thermocouple channels herein can be configured to include a thermocouple extending therein. The susceptor body 200 may include a thermocouple disposed at least partially within the thermocouple channel 262. The susceptor body 200 may include one or more radial thermocouple channels 262. The radial thermocouple channel 262 may be positioned between the front face 202 and the back face 204.

The pedestal 218 may include a longitudinal thermocouple channel 264 extending longitudinally therethrough that is configured to receive a thermocouple therein. The longitudinal thermocouple channel 264 may be in fluid communication with the thermocouple channel 262. The thermocouple may be configured to measure a temperature at various points extending radially through the thermocouple channel 262. Such a long thermocouple channel 262 can allow access to more precise temperature information throughout a greater portion of the susceptor body 200 and/or allow for modifications to the deposition process as needed.

Figure 7:
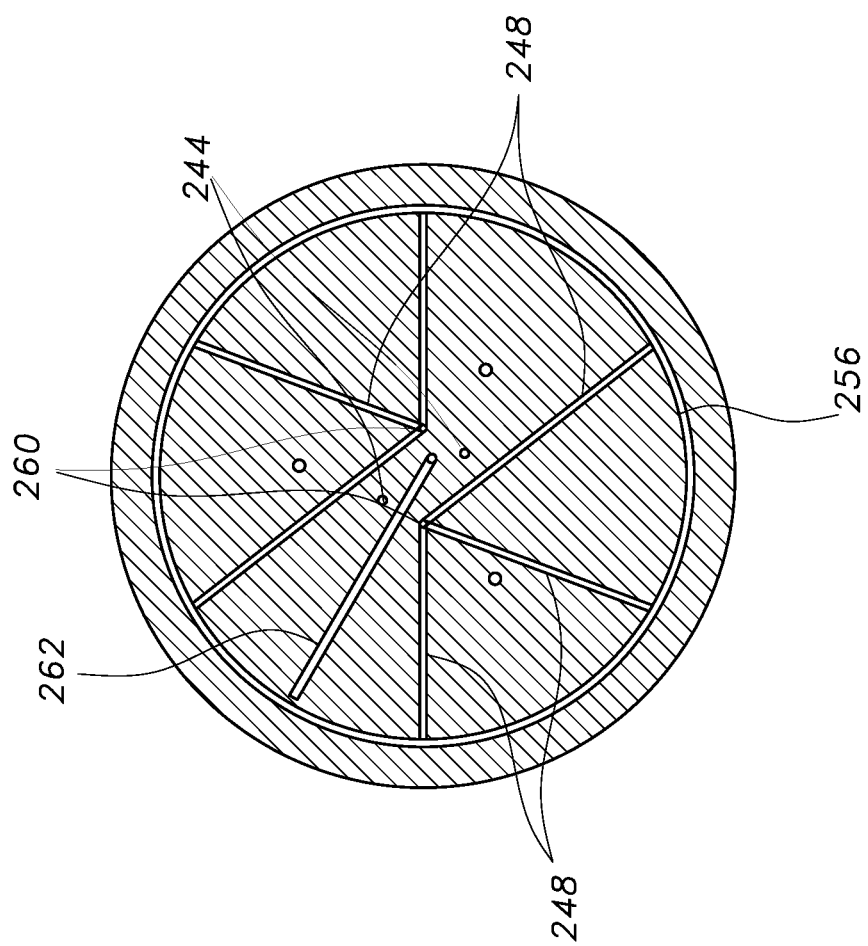
FIG. 7 shows a cross-sectional top view of an example susceptor body sectioned between the front face and the back face.

FIG. 7 shows a cross-sectional top view of an example susceptor body 200 between the front face 202 and the back face 204. As shown, the susceptor body 200 can include a plurality of radial purge channels 248. The radial purge channels 248 may be in fluid communication with corresponding pedestal purge channels 260, as shown. One or more groupings of radial purge channels 248 may be associated with corresponding pedestal purge channels 260. Each of the radial purge channels 248 within a grouping may be radially offset from each other. Additionally or alternatively, radial purge channels 248 between groupings may be offset from each other. For example, a radial offset (e.g., within grouping, between grouping) may be between about 5 degrees and 140 degrees. For example, a radial offset may be about between 50 degrees and 70 degrees. In some embodiments, the radial offset may be approximately equal between neighboring radial purge channels 248 within the same grouping. Additionally or alternatively, the offset may be approximately equal among all neighboring radial purge channels 248. The thermocouple channel 262 may be disposed approximately in the same plane as one or more of the radial purge channels 248, as shown.

Figure 8:
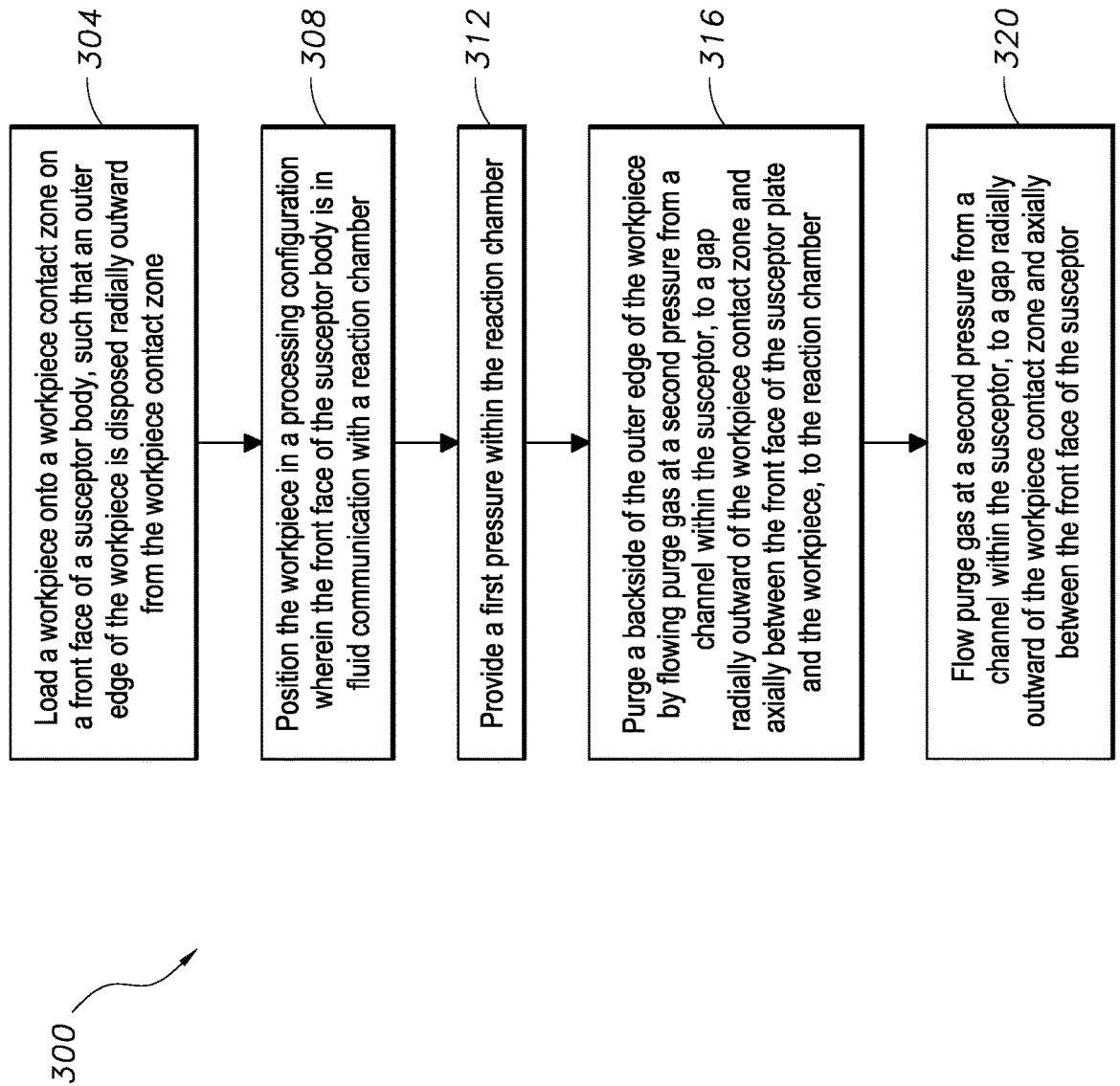
FIG. 8 shows an example method for purging a workpiece susceptor.

FIG. 8 shows an example method 300 for purging a workpiece susceptor, such as embodiments of susceptors that include the susceptor bodies 200 described with reference to FIGS. 3-7, using a processing apparatus, such as apparatus 100, and in some embodiments, a controller, such as controller 113, described with reference to FIGS. 2-2. The method 300 may include loading a workpiece onto a workpiece contact zone on a front face of a susceptor body such that an outer edge of the workpiece is disposed radially outward from the workpiece contact zone, as shown at block 304. The method 300 can include positioning the workpiece in a processing configuration such that the front face of the susceptor body is in fluid communication with a reaction chamber, as shown in block 308. The positioning may include positioning a back face of the susceptor body so that it is in fluid communication with a loading chamber. As shown in block 312, the method 300 can include providing a first pressure within the reaction chamber. At block 316, the method 300 can include purging a backside of the outer edge of the workpiece by flowing purge gas at a second pressure from a plurality of channels within the susceptor.

The purge gas may be passed to a gap radially outward of the workpiece contact zone and axially between the front face of the susceptor plate and the workpiece to the reaction chamber. In some embodiments, the second pressure is greater than the first pressure. In some embodiments, the second pressure is configured to be higher than the first pressure within the loading chamber.

In some embodiments, the workpiece contact zone includes a circumferential rib extending from the front face. In some embodiments, loading the workpiece onto the workpiece contact zone can include loading the workpiece radially inward of a workpiece retaining portion positioned radially outward from the workpiece contact zone. The workpiece retaining portion may be configured to prevent radial movement of the workpiece, such as disclosed herein. Purging the backside of the outer edge of the workpiece may include flowing purge gas through a plurality of axial channels disposed within the susceptor body. The axial channels can extend through the workpiece susceptor body and the back face of the susceptor body.

In some embodiments, purging the backside of the outer edge of the workpiece includes flowing purge gas through a plurality of openings extending into an outer portion of the front face, each of the openings disposed radially outward of the workpiece contact zone of the susceptor body. One more of the openings may be disposed in fluid communication with corresponding channels of the plurality of axial channels. In some embodiments, purging the backside of the outer edge of the workpiece can include flowing purge gas through a plurality of radial channels that are positioned between the front face and the back face. The radial channels can extend from and/or be in fluid communication with at least one of the plurality of axial channels.

The method 300 may include applying a vacuum to the backside of the workpiece via a plurality of apertures extending into the inner portion of the front face. Applying the vacuum to the backside of the workpiece can include applying the vacuum to at least one longitudinal vacuum channel extending through a pedestal that is configured to support the back face. The at least one longitudinal vacuum channel may be in fluid communication with at least one of the plurality of the apertures. The features of one or more aspects of the method 300 can include functionality and features of the susceptor body 200 disclosed above with respect to FIGS. 1-7.

Illustrative Examples

Various examples are provided below.

In a 1st example, a workpiece susceptor body comprising: a front face configured to support a workpiece; a back face opposite the front face; a workpiece contact zone at least partially forming a support boundary around an inner portion of the front face, the workpiece contact zone configured to be disposed radially inward of an outer edge of a workpiece positioned on the front face in a processing configuration; one or more axial channels disposed within the susceptor body, the axial channels connecting to one or more openings extending into an outer portion of the front face, each of the openings disposed radially outward of the workpiece contact zone of the susceptor body; wherein the workpiece contact zone is at a greater elevation than the outer portion of the face to form a gap radially outward of the workpiece contact zone and axially between the face of the susceptor body and the workpiece.

In a 2nd example, the workpiece susceptor body of example 1, wherein the workpiece contact zone comprises a circumferential rib extending from the front face.

In a 3rd example, the workpiece susceptor body of any of examples 1-2, further comprising the workpiece.

In a 4th example, the workpiece susceptor body of any of examples 1-3, further comprising a workpiece retaining portion positioned radially outward from the openings, the workpiece retaining portion configured to prevent radial movement of the workpiece.

In a 5th example, the workpiece susceptor body of example 4, wherein the workpiece retaining portion is disposed at a greater elevation than the workpiece contact zone.

In a 6th example, the workpiece susceptor body of any of examples 1-5, wherein the axial channels extend through the workpiece susceptor body and the back face.

In a 7th example, the workpiece susceptor body of any of examples 1-6, further comprising a plurality of radial channels positioned between the front face and the back face, and extending from and in fluid communication with at least one of the plurality of axial channels.

In an 8th example, the workpiece susceptor body of example 7, further comprising a pedestal configured to support the back face, and at least one longitudinal purge channel extending through the pedestal and configured to be in fluid communication with at least one of the plurality of radial channels.

In a 9th example, the workpiece susceptor body of example 8, further comprising one or more apertures extending into the inner portion of the front face, the plurality of apertures configured to be in fluid communication with a vacuum.

In a 10th example, the workpiece susceptor body of example 9, further comprising at least one longitudinal vacuum channel extending through the pedestal and configured to be in fluid communication with at least one of the plurality of the apertures.

In a 11th example, the workpiece susceptor body of example 10, further comprising a plurality of radial grooves extending into the front face, each of the plurality of radial grooves in fluid communication with at least one of the plurality of apertures.

In a 12th example, the workpiece susceptor body of example 11, further comprising a circumferential groove in fluid communication with the plurality of radial grooves.

In a 13th example, the workpiece susceptor body of example 12, wherein the circumferential groove forms an inner vacuum region on the front face, further comprising a plurality of protrusions extending from the front face within the inner vacuum region.

In a 14th example, the workpiece susceptor body of any of examples 7-13, wherein the plurality of radial channels comprises a plurality of radial fluid channels, the plurality of radial fluid channels further comprising at least one radial thermocouple channel positioned between the front face and the back face, the radial thermocouple channel configured to receive a thermocouple.

In a 15th example, the workpiece susceptor body of any of examples 8-13, wherein the plurality of radial channels comprises a plurality of radial fluid channels, further comprising at least one radial thermocouple channel positioned between the front face and the back face, further comprising at least one longitudinal thermocouple channel extending through the pedestal, the at least one radial thermocouple channel and longitudinal thermocouple channel configured to receive a thermocouple.

In a 16th example, a method for purging a workpiece susceptor comprises: loading a workpiece onto a workpiece contact zone on a front face of a susceptor body, such that an outer edge of the workpiece is disposed radially outward from the workpiece contact zone; positioning the workpiece in a processing configuration wherein the front face of the susceptor body is in fluid communication with a reaction chamber and wherein a back face of the susceptor body is in fluid communication with a loading chamber; providing a first pressure within the reaction chamber; purging a backside of the outer edge of the workpiece by flowing purge gas at a second pressure from one or more channels within the susceptor body, to a gap radially outward of the workpiece contact zone and axially between the front face of the susceptor plate and the workpiece, to the reaction chamber, wherein the second pressure is greater than the first pressure.

In a 17th example, the method of example 16, wherein the workpiece contact zone comprises a circumferential rib extending from the front face.

In a 18th example, the method of any of examples 16-17, wherein loading the workpiece onto the workpiece contact zone comprises loading the workpiece radially inward of a workpiece retaining portion positioned radially outward from the workpiece contact zone, the workpiece retaining portion configured to prevent radial movement of the workpiece.

In a 19th example, the method of any of examples 16-18, wherein purging the backside of the outer edge of the workpiece comprises flowing purge gas through one or more axial channels disposed within the susceptor body, wherein the axial channels extend through the workpiece susceptor body and the back face.

In a 20th example, the method of example 19, wherein purging the backside of the outer edge of the workpiece further comprises flowing purge gas through one or more openings extending into an outer portion of the front face, each of the openings disposed radially outward of the workpiece contact zone of the susceptor body, each of the openings disposed in fluid communication with at least one of the one or more axial channels.

In a 21st example, the method of examples 20, wherein purging the backside of the outer edge of the workpiece further comprises flowing purge gas through a plurality of radial channels positioned between the front face and the back face, and the radial channels extending from and being in fluid communication with at least one of the one or more axial channels.

In a 22nd example, the method of example 21, further comprising applying a vacuum to the backside of the workpiece via one or more apertures extending into the inner portion of the front face.

In a 23rd example, the method of example 22, wherein applying the vacuum to the backside of the workpiece comprises applying the vacuum to at least one longitudinal vacuum channel extending through a pedestal configured to support the back face, the at least one longitudinal vacuum channel in fluid communication with at least one of the one or more apertures.

In a 24th example, the method of any of examples 16-23, wherein the purge gas comprises an inert gas and a reactive gas.

In a 25th example, the method of example 24, wherein the inert gas comprises argon and the reactive gas comprises hydrogen.

In a $26^{th}$ example, the method of any of examples 16-23, wherein purging comprises a first purge step comprising a first purge gas consisting essentially of an inert gas, and a second purge step comprising a second purge gas comprising an inert gas and a reactive gas In a $27^{th}$ example, the method of example 26, wherein the second purge step sequentially follows the first purge step.

Additional Considerations

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

The word "exemplary" is used herein to mean "serving as an example, instance, or illustration." Any aspect or embodiment described herein as "exemplary" is not necessarily to be construed as preferred or advantageous over other aspects or embodiments. Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of, or combined with, any other aspect described. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosures set forth herein. It should be understood that any aspect disclosed herein may be embodied by one or more elements of a claim.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount, depending on the desired function or desired result.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products. For example, any of the components for an energy storage system described herein can be provided separately, or integrated together (e.g., packaged together, or attached together) to form an energy storage system.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

The headings provided herein, if any, are for convenience only and do not necessarily affect the scope or meaning of the devices and methods disclosed herein.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A method for purging a workpiece susceptor, the method comprising:
    loading a workpiece onto a workpiece contact zone on a front face of a susceptor body, such that an outer edge of the workpiece is disposed radially outward from the workpiece contact zone, wherein the workpiece contact zone is substantially annular, and wherein loading the workpiece onto the workpiece contact zone comprises loading the workpiece radially inward of a workpiece retaining portion of the susceptor body positioned radially outward from the workpiece contact zone, the workpiece retaining portion configured to retain the workpiece;
    positioning the workpiece in a processing configuration wherein the front face of the susceptor body is in fluid communication with a reaction chamber and wherein a back face of the susceptor body is in fluid communication with a loading chamber;
    providing a first pressure within the reaction chamber; and purging a backside of the outer edge of the workpiece by flowing purge gas at a second pressure from one or more channels within the susceptor body, to a gap radially outward of the workpiece contact zone and axially between the front face of the susceptor plate and the workpiece, to the reaction chamber, wherein the second pressure is greater than the first pressure.

2. The method of claim 1, wherein the one or more channels comprises one or more axial channels, wherein purging the backside of the outer edge of the workpiece comprises flowing the purge gas through the one or more axial channels disposed within the susceptor body, wherein the one or more axial channels extend through the workpiece susceptor body and the back face.

3. The method of claim 1, wherein the purge gas comprises an inert gas and a reactive gas.

4. The method of claim 3, wherein the inert gas comprises argon and the reactive gas comprises hydrogen.

5. The method of claim 1, wherein loading the workpiece onto the workpiece contact zone comprises loading the workpiece at a greater elevation than an outer portion of the front face to form the gap radially outward of the workpiece contact zone and axially between the front face of the susceptor body and the workpiece.

6. The method of claim 1, wherein the workpiece retaining portion is positioned radially outward from openings within the susceptor that are in fluid communication with the one or more channels.

7. The method of claim 6, wherein loading the workpiece onto the workpiece contact zone comprises supporting the workpiece on the workpiece contact zone at a lower elevation than the workpiece retaining portion.

8. The method of claim 1, wherein the one or more channels comprises a plurality of radial channels and a plurality of axial channels, wherein purging the backside of the outer edge of the workpiece comprises flowing the purge gas through the plurality of radial channels positioned between the front face and the back face, and wherein the plurality of radial channels extend from and are in fluid communication with at least one of the plurality of axial channels.

9. The method of claim 8, further comprising evacuating gas between the workpiece and the susceptor via at least one longitudinal vacuum channel extending through a pedestal configured to support the back face.

10. The method of claim 9, wherein evacuating the gas between the workpiece and the susceptor comprises evacuating the gas via one or more apertures extending into an inner portion of the front face.

11. The method of claim 1, further comprising receiving a thermal reading via a thermocouple disposed within at least one radial thermocouple channel positioned between the front face and the back face.

* * * * *